United States Patent
Golov

(10) Patent No.: US 11,894,097 B2
(45) Date of Patent: Feb. 6, 2024

(54) CONFIGURING A HOST INTERFACE OF A MEMORY DEVICE BASED ON MODE OF OPERATION

(71) Applicant: Micron Technology, Inc., Boise, ID (US)

(72) Inventor: Gil Golov, Backnang (DE)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

(21) Appl. No.: 17/356,431

(22) Filed: Jun. 23, 2021

(65) Prior Publication Data

US 2021/0327475 A1 Oct. 21, 2021

Related U.S. Application Data

(63) Continuation of application No. 16/783,611, filed on Feb. 6, 2020, now Pat. No. 11,087,801.

(51) Int. Cl.
*G11C 7/10* (2006.01)
*G11C 11/409* (2006.01)
*G06F 13/16* (2006.01)
*G06F 9/30* (2018.01)

(52) U.S. Cl.
CPC ........ *G11C 7/1045* (2013.01); *G06F 9/30101* (2013.01); *G06F 9/30189* (2013.01); *G06F 13/1668* (2013.01); *G11C 11/409* (2013.01)

(58) Field of Classification Search
CPC . G11C 7/1045; G11C 11/409; G06F 9/30101; G06F 9/30189; G06F 13/1668
See application file for complete search history.

(56) References Cited

U.S. PATENT DOCUMENTS

| | | | |
|---|---|---|---|
| 7,383,372 B2 | 6/2008 | Tjia et al. | |
| 7,805,553 B2 | 9/2010 | Kasahara et al. | |
| 8,386,694 B2 | 2/2013 | Sukegawa | |
| 8,631,191 B2 | 1/2014 | Hashimoto | |
| 9,009,370 B2 | 4/2015 | Solomon et al. | |
| 9,244,872 B2 | 1/2016 | Barbiero et al. | |
| 9,448,742 B2 | 9/2016 | Cheng et al. | |
| 9,912,902 B2 | 3/2018 | Oien et al. | |
| 10,210,123 B2 | 2/2019 | Olarig et al. | |
| 10,394,731 B2 | 8/2019 | Davis et al. | |
| 10,606,767 B2* | 3/2020 | Olarig | H04N 5/907 |
| 11,010,316 B2* | 5/2021 | Park | G06F 12/0866 |

(Continued)

OTHER PUBLICATIONS

International Search Report and Written Opinion, PCT/US2021/019241, dated Jun. 17, 2021.

(Continued)

*Primary Examiner* — Vanthu T Nguyen
(74) *Attorney, Agent, or Firm* — Greenberg Traurig

(57) ABSTRACT

A memory device stores data for a host device. In one approach, a method includes: selecting, by the memory device, a first mode of operation for a host interface that implements a communication protocol for communications between the memory device and the host device. The host interface is configured to implement the communication protocol using a mode selected by the memory device from one of several available modes. In response to selecting the first mode, resources of the memory device are configured to customize the host interface for operation in the first mode.

19 Claims, 5 Drawing Sheets

(56) References Cited

U.S. PATENT DOCUMENTS

| | | |
|---|---|---|
| 11,018,444 B2 | 5/2021 | Olarig et al. |
| 11,087,801 B1 | 8/2021 | Golov |
| 11,243,896 B2 | 2/2022 | Sato |
| 2004/0177194 A1 | 9/2004 | Benson et al. |
| 2005/0010712 A1 | 1/2005 | Kim et al. |
| 2013/0212325 A1 | 8/2013 | Hashimoto |
| 2015/0143017 A1 | 5/2015 | Brontvein et al. |
| 2018/0357076 A1 | 12/2018 | Wietfeldt et al. |
| 2019/0179569 A1 | 6/2019 | Yang |
| 2019/0196924 A1 | 6/2019 | Gregg et al. |
| 2019/0287583 A1 | 9/2019 | Hollis |
| 2020/0026683 A1 | 1/2020 | Olarig |
| 2020/0301618 A1 | 9/2020 | Olarig |
| 2021/0249054 A1 | 8/2021 | Golov |
| 2021/0303483 A1 | 9/2021 | Sato |
| 2022/0107906 A1 | 4/2022 | Sato |
| 2022/0138122 A1 | 5/2022 | Ben-Rubi et al. |

OTHER PUBLICATIONS

International Search Report and Written Opinion, PCT/US2021/015512, dated May 13, 2021.

\* cited by examiner

CONFIGURING A HOST INTERFACE OF A MEMORY DEVICE BASED ON MODE OF OPERATION

RELATED APPLICATIONS

The present application is a continuation application of U.S. patent application Ser. No. 16/783,611, filed Feb. 6, 2020, and entitled "Configuring a Host Interface of a Memory Device Based on Mode of Operation," the entire disclosure of which application is hereby incorporated herein by reference.

FIELD OF THE TECHNOLOGY

At least some embodiments disclosed herein relate to memory devices in general, and more particularly, but not limited to configuring a host interface of a memory device based on a mode of operation.

BACKGROUND

Various types of non-volatile storage devices can be used to store data. Non-volatile storage devices can include NAND flash memory devices. NAND flash is a type of flash memory constructed using NAND logic gates. Alternatively, NOR flash is a type of flash memory constructed using NOR logic gates. Currently, the use of NAND flash predominates the flash market.

Typical computer storage devices have controllers that receive data access requests from host computers and perform programmed computing tasks to implement the requests in ways that may be specific to the media and structure configured in the storage devices. In one example, a flash memory controller manages data stored in flash memory and communicates with a computer device. In some cases, flash memory controllers are used in solid state drives for use in mobile devices, or in SD cards or similar media for use in digital cameras.

Firmware can be used to operate a flash memory controller for a particular storage device. In one example, when a computer system or device reads data from or writes data to a flash memory device, it communicates with the flash memory controller.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
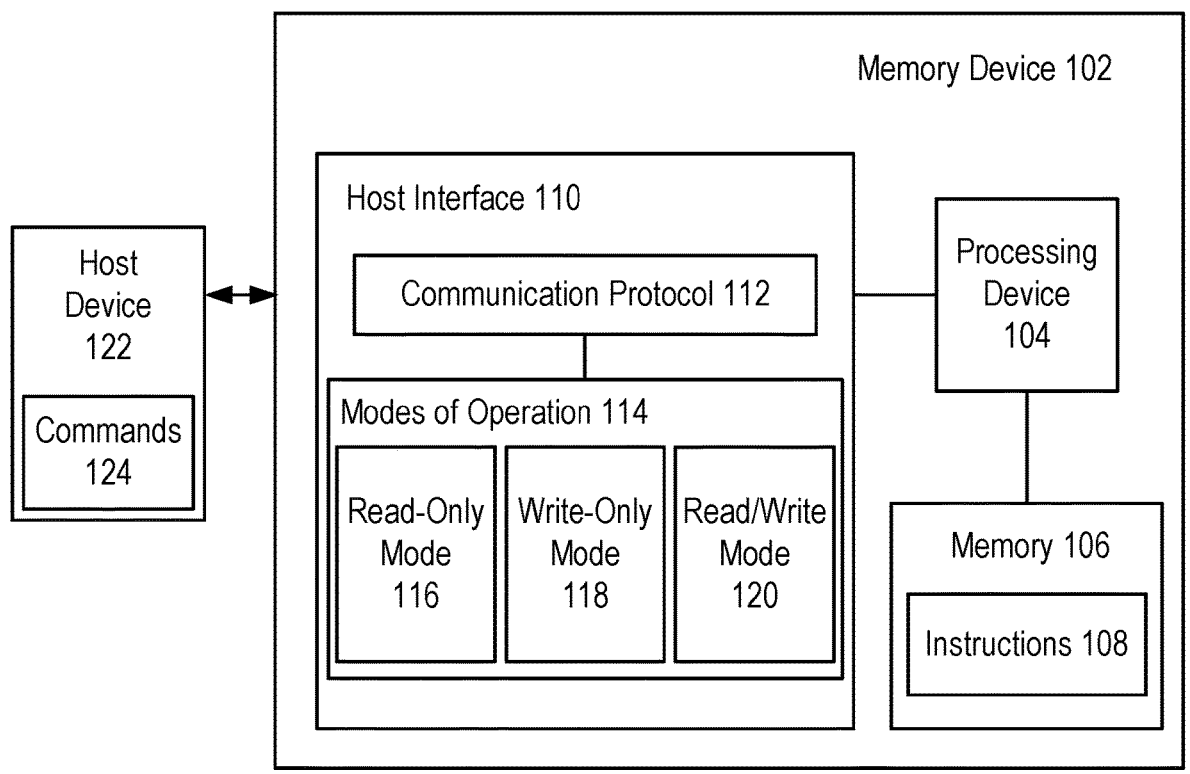
FIG. 1 illustrates a memory device having a host interface that is configurable to operate in one of several modes of operation, in accordance with some embodiments.

The following disclosure describes various embodiments for configuring a host interface of a memory device based on a mode of operation. At least some embodiments herein relate to flash memory devices. The memory device may, for example, store data used by a host device (e.g., a computing device of an autonomous vehicle, or another computing device that accesses data stored in the memory device). In one example, the memory device is a solid-state drive mounted in an electric vehicle.

Flash memory and SSD manufacturers are continuously looking for ways to improve product performance. Some applications, such as capturing scientific sensor data, require high performance, but have asymmetric write/read workloads.

Most flash/SSD devices support a complete standard interface (e.g., ONFI, CFI, NVMe, SATA, etc.) The standard interfaces are designed for a mix of write/read workloads. They are not optimized for write-only or read-only workloads. This presents a technical problem due to the memory host interface being inefficient in use of resources and/or performance being slower than desired due to a misallocation of resources to the types of functions that are required by the workload.

In one example, write-only workloads include applications such as automotive or airline black boxes. Vehicle operation data is written continuously. Only after a crash event is the vehicle operation data read from the device. Another example of a write-heavy workload is storing sensor data from scientific experiments. Scientific experiments can collect massive amounts of data from sensors. This data needs to be captured and quickly written to avoid losing data.

In one example, read-only workloads include write-once, read-many applications. Examples include online encyclopedias or product catalogs. After this data is written, it is read frequently but is seldom re-written. Another example of a read-heavy workload is reading scientific sensor data that has been captured and stored. After the sensor data has been stored, the data is later read out for post-processing. This results in large read-only data sets.

Various embodiments of the present disclosure provide a technological solution to one or more of the above technical problems. In one embodiment, by optimizing or otherwise configuring for write-only or read-only workloads, a memory device can function at improved or peak performance for write-only or read-only applications. For example, flash memory/SSD devices that are used for applications with asymmetric write/read workloads achieve improved performance by configuring the flash/SSD device (e.g., by customizing memory and/or processing logic resources) for write-only operation or read-only operation.

In one embodiment, during the start-up process for a memory device, a determination (e.g., by a controller) of the type of application (e.g., black box, etc.) for which the memory device will be operated is used to customize the flash/SSD host interface for improved performance. For example, when the flash/SSD device is used for a write-only application (e.g., vehicle black box), the read-related aspects of the host interface and/or other portions of the memory device can be suspended for optimized performance.

In one embodiment, a flash or SSD device configured in a write-only mode does not implement interface protocol support for read operations. In one embodiment, a flash or SSD device configured in a read-only mode does not implement interface protocol support for write operations.

In one embodiment, when a flash/SSD device is powered-on, it retrieves configuration information indicating mode of operation (e.g., read/write, write-only or read-only operation). In one embodiment, read/write configuration data is stored in non-volatile memory within the flash/SSD device. In one embodiment, read/write configuration data is transmitted to the flash/SSD device by a command received through an interface (e.g., JTAG, ONFI, SATA, etc.).

In one embodiment, a memory device has a set of resources (e.g., processing bandwidth, one or more registers, interface signals dedicated for read or write operations, one or more caches, total memory capacity, access to various memory regions each having a different latency, some fast and some slow) for implementing a host interface. When the memory device detects that it is to be operated in a first mode (e.g., a mode that is available from one of several modes in which the device can operate), the memory device configures the set of resources in a first way to customize the host interface for the first mode. When the memory device detects that it is to be operated in a second mode, the memory device configures the set of resources in a second way to customize the host interface for the second mode.

The first mode and the second mode can be based on a same standard (e.g., an interface/communications protocol) for communications between a memory device and a host. However, the first mode may be limited to a subset allowed by the standard, such that certain commands allowed in the second mode are not allowed in the first mode. Alternatively, the first and second modes can be both limited to subsets and the subsets are different. Such resources can include fast memory (e.g., low memory latency), register, processing logic, host interface signals, etc. For example, when the memory device knows (e.g., based on configuration data) that it will always only receive read commands from a host, the memory device does not have to implement the protocol processing that is designed to distinguish/interpret/decode the read commands apart from write commands. This part of resources (e.g., memory, time, processing logic) of the memory device can be used for other purposes (e.g., to process other commands, such as later-received commands, maintenance functions, error correction functions, etc.).

In one embodiment, a memory device contains host interface signals defined by a communications protocol (e.g., PCIe, NVMe, ONFI, etc.) for transmitting read data, and other host interface signals defined for transmitting write data. When the memory device knows (e.g., based on configuration data) that it will always only receive write commands, it can redefine some, or all, of the host interface signals used for transmitting read data to host interface signals used for transmitting write data. When the memory device knows that it will always only receive read commands, it can redefine some, or all, of the host interface signals used for transmitting write data to host interface signals used for transmitting read data.

For example, a memory device may have a PCIe host interface with eight data lanes (having pairs of complementary data signals). More specifically, each data lane is composed of a pair of signals defined for transmitting write data and a pair of signals defined for transmitting read data. An eight lane PCIe host interface has a total of eight sets of write signals and eight sets of read signals. If the memory device knows it will only be receiving write commands (e.g., it is configured to operate as a vehicle black box in normal operation), it can redefine the eight sets of data signals used for transmitting read data to be an additional eight sets of data signals used for transmitting write data for a total of sixteen sets of data signals used for transmitting write data.

If the memory device knows it will only be receiving read commands (e.g., during boot time to read software from the memory device), it can redefine the eight sets of data signals used for transmitting write data to be an additional eight sets of data signals used for transmitting read data for a total of sixteen sets of data signals used for transmitting read data.

In one embodiment, the memory device can dynamically change the number of host interface signals used to transmit read data and write data. For example, when the memory device knows (e.g., based on application context) the workload of read commands and write commands it will receive, it can redefine some of the host interface signals defined for transmitting read data to be used for transmitting write data, or host interface signals defined for transmitting write data to be used for transmitting read data. For example, a host device may run an application that generates 25% read commands and 75% write commands. The memory device may configure the host interface to use, for example, four sets of PCIe data signals for transmitting read data and twelve sets of PCIe signals for transmitting write data.

In one embodiment, a memory device such as a general-purpose flash/SSD drive implements the standard(s) to support any possible uses (e.g., commands, functions, etc.) defined in an interface standard. However, if a designer knows that a particular drive is used only for a particular type of access (e.g., write-only, or read-only), or a particular pattern of data access (e.g., respective proportions of read and write commands, or a pattern of commands), then the designer can configure or optimize the flash/SSD host interface for that particular type of access (and there is no need to implement other protocols that will not be used). For example, if the SSD is read-only, the resources for processing write commands can be eliminated.

In one example, instead of using a read-only SSD, it is preferred to provide a drive that can be reconfigured at the time of starting the SSD. An indication of how the SSD is used will be provided to the SSD; and when the SSD is booted up, it sets up itself for best performance for that particular usage type.

In one example, a black-box SSD may be normally write-only. However, at the time of diagnosis or accident investigation, the SSD is booted as read-only, or read-write enable.

FIG. 1 illustrates a memory device 102 that can be configured for one of two or more modes of operation, in accordance with some embodiments. The memory device 102 is configured to receive commands (e.g., commands 124 from a host device 122) and store and retrieve data (e.g., in memory 106). The memory device 102 includes a processing device (e.g., processing device 104, such as a controller, FPGA, and/or ASIC), memory (e.g., memory 106) and a host interface 110 connected to the host device 122. As examples, the processing device 104 may be a microprocessor or an embedded controller, the host device 122 may be a computing system or an embedded computer, and memory 106 may be a non-volatile memory such as flash memory.

The host device 122 may run applications requiring access to memory device 102. These applications may have different patterns of data access to memory device 102. For example, a host device 122 configured for a vehicle black box application, or for storing sensor data from a scientific experiment may have a write-only data pattern when used in normal operation. After an event, such as a crash, the data access pattern for the vehicle black box may change to read-only (e.g., automatically by the controller of the black box, or due to a manual user setting after the crash). The scientific sensor application may change the data pattern to read-only after data collection is complete and data post-processing is starting. Other applications, such as general-purpose computing systems, may need both write and read access for normal operation.

Memory device 102 receives commands 124 (e.g., read or write) from the host device 122 through the host interface 110. The host interface 110 is configured to implement a communication protocol 112 (e.g., NVMe, SATA, ONFI, CFI). The host interface 110 can be configured into a plurality of modes of operation 114 (e.g., the selection may be made by processing device 104). Different modes of operation 114 may include support for different subsets of the same communication protocol. For example, the host interface 110 may be configured to operate in read-only mode 116, write-only mode 118 or read/write mode 120.

In read/write mode 120, the host interface 110 is configured to process both read and write commands of the communication protocol 112. In write-only mode 118, the host interface 110 is configured to only process communication protocol write commands. In write-only mode 118, resources normally required for processing read commands (e.g., processing logic, registers, buffers, fast memory, regions of memory, etc.) can be used for other purposes. In read-only mode 116, resources normally required for processing write commands (e.g., processing logic, registers, buffers, fast memory, regions of memory, etc.) can be used for other purposes. When resources are configured for write-only mode 118 or read-only mode 116, the time required for the host interface 110 to process commands 124 from the host device 122 may be reduced.

In one embodiment, the processing device 104 processes commands 124 received by the host interface 110. The processing device 104 is configured to process commands 124 based on the mode of operation 114 of the host interface 110. In one example, the processing device 104 determines the mode of operation 114 when a command is received from host device 122.

The processing device 104 uses instructions (e.g., software instructions 108) to configure parts of the memory device 102 (e.g., host interface 110 and memory 106) and/or to execute other methods as described in this disclosure. The instructions 108 are stored in a memory device. In one example, the instructions 108 are stored in memory device 106 external to the processing device 104. In another example, the instructions 108 are stored in memory internal to processing device 104.

In one embodiment, the instructions 108, retrieved from memory 106, instruct the processing device 104 to select a first mode of operation 114 for the host interface 110. In response to selecting the first mode of operation 114 of the host interface 110, memory device 102 resources (e.g., memory 106 and processing device 104) are customized for operation in the first mode. For example, if the first mode of operation is write-only mode 118, then resources used for processing read commands (e.g., processing logic, registers, buffers, fast memory, memory regions, etc.) can be redirected to other functions.

In one embodiment, the mode of operation 114 of the host interface 110 is received through commands 124 from host device 122 transmitted through the host interface 110. In response to the commands 124 selecting the first mode of operation 114 of the host interface 110, memory device 102 resources (e.g., memory 106 and processing device 104) are customized for operation in the first mode.

Memory device 102 may power-up with the host interface 110 in a default first mode of operation 114. After power-up, the mode of operation 114 of the host interface 110 may be changed to a second mode of operation 114. For example, memory device 102 may power-up in read/write mode 120. After power-on, commands 124 from the host device 122 may cause a change in the mode of operation 114 to write-only mode 118 or read-only mode 116. In one example, the change is implemented by processing device 104 in response to receiving a command.

In one embodiment, memory device 102 determines the context of operation, and in response to determining the context of operation, selects a mode of operation 114 for the host interface 110. For example, if the memory device 102 determines that the current application is a vehicle black box in normal operation mode, memory device 102 sets the host interface 110 mode of operation 114 to write-only mode 118.

In another embodiment, a context of operation is determined for memory device 102. The context is based at least in part on context data provided by host device 122. In one example, the context data indicates a type of command that will be sent to memory device 102. In another example, the context data indicates a type of application that will be executed by host device 122.

In response to determining the context of operation, a different mode of operation is selected for the host interface 110. In response to selecting the different mode, the resources of the memory device 102 are configured to customize the host interface 110 for operation in the different mode. In one example, configuring the resources includes changing an allocation of the regions of memory 106 to processing device 104. In one example, changing the allocation includes changing a portion of memory space allocated for handling execution of instructions 108. In one example, changing the portion of memory space includes increasing an allocation of memory space to storage of data and/or commands received from host device 122.

In another embodiment, the context of operation for memory device 102 is determined based at least in part on sensor data obtained from one or more sensors of memory device 102 and/or sensors of host device 122. In one example, the sensors include temperature sensors and/or accelerometers.

Figure 2:
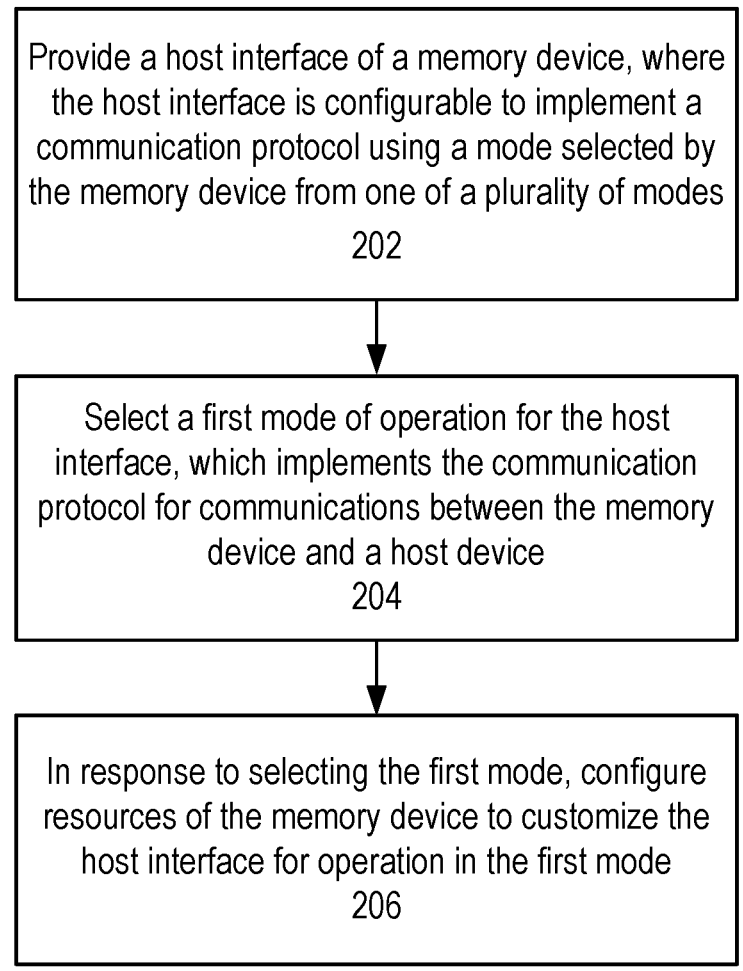
FIG. 2 shows a method for configuring a host interface of a memory device based on a selected mode of operation, in accordance with some embodiments.

FIG. 2 shows a method for configuring a host interface of a memory device based on a selected mode of operation, in accordance with some embodiments. For example, the method of FIG. 2 can be implemented in the system of FIG. 1. In one example, the host interface 110 provides an interface between the host device 122 for accessing data stored in various memory regions (e.g., memories of different latencies, and/or different types) of memory 106. In one example a controller of memory device 102 implements communication protocol 112 and makes a selection of a mode of operation 114. In one example, configuring resources includes selecting a memory of a particular type, latency, or other characteristic that will be used and/or associated with servicing of a particular type of command from the host. The handling of this command in a new mode of operation can be configured differently than the handling of the command as implemented for a prior mode (e.g., a prior read/write mode, or a normal mode).

The method of FIG. 2 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 2 is performed at least in part by one or more processing devices (e.g., a controller or other processing device 104 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 202, a host interface of a memory device is provided. The host interface can be configured to implement a communication protocol using a mode selected by the memory device from one of a plurality of modes. In one example, the host interface is host interface 110. In one example, the plurality of modes includes modes 116, 118, 120.

At block 204, a first mode of operation for the host interface is selected. The host interface implements the communication protocol for communications between the memory device and a host device. In one example, the host device is host device 122.

At block 206, in response to selecting the first mode, resources of the memory device are configured to customize the host interface for operation in the first mode. In one example, the resources are memory and processing resources of memory device 102. In one example, the processing resources are firmware for processing device 104 that is stored in memory 106.

In one embodiment, a method for a memory device comprises: selecting, by a memory device, a first mode of operation for a host interface that implements a communication protocol for communications between the memory device and a host device, wherein the host interface is configured to implement the communication protocol using a mode selected by the memory device from one of a plurality of modes; and in response to selecting the first mode, configuring resources of the memory device to customize the host interface for operation in the first mode. In one example, memory device 102 selects read-only mode 116. Host interface 110 is then configured to customize resources for read-only operation.

In one embodiment, the communication protocol allows usage of a first type of command and a second type of command; and the host interface, while operating in the first mode, allows usage of the first type of command, and suspends usage of the second type of command. In one example, a communication protocol (e.g., NVMe, PCIe, SATA, SAS, CFI, ONFI) allows read commands and write commands. The host interface 110, when configured for a first mode of operation 114, allows read commands and suspends usage of write commands.

In one embodiment, the plurality of modes includes a second mode; and the host interface, while operating in the second mode, allows usage of the first type of command and the second type of command. In one example, the host interface 110, when configured for a second mode of operation 114, allows read commands and write commands.

In one embodiment, the plurality of modes includes a second mode; and the host interface, while operating in the second mode, allows usage of the second type of command, and suspends usage of the first type of command. In one example, the host interface 110, when configured for a second mode of operation 114, allows write commands and suspends usage of read commands.

In one embodiment, the method further comprises: determining a context of operation for the memory device; in response to determining the context of operation, selecting a second mode of operation for the host interface; and in response to selecting the second mode, configuring the resources of the memory device to customize the host interface for operation in the second mode. In one example, the memory device 102 is a non-volatile memory device (e.g., SSD, hard drive, 3D XPoint memory device, flash memory device). The context of operation for the memory device 102 is determined (e.g., by the host device 122 or by the memory device 102) to be a specific application (e.g., a vehicle black box in normal operation). In response to identifying the context as being a vehicle black box application in normal operation, the mode of operation 114 of the host interface 110 is set to write-only mode 118. In write-only mode 118, the memory device 102 resources are customized for operation in write-only mode 118. For example, read buffers can be re-allocated for other purposes, write buffers can be expanded, etc.

In one embodiment, the resources include at least one of a memory resource or a processing resource. In one example, a processing resource is a microprocessor or embedded processor. A memory resource may include, for example, an SSD, hard drive, 3D XPoint memory device, flash memory device, etc.

In one embodiment, the resources include at least one of a memory region, a register, or a processing device. In one example, regions of memory within a multi-level per cell flash device (e.g., MLC, TLC, QLC, etc.) are configured as single level per cell (SLC) regions and used as fast write buffers. In write-only mode 118, the host interface 110 can be customized by expanding the SLC fast write buffer regions.

In one embodiment, prior to selecting the first mode, the host interface uses first resources of the memory device for processing a first type of command, and second resources of the memory device for processing a second type of command; and configuring the resources of the memory device includes suspending usage of the second resources for processing the second type of command. In one example, a memory device 102 (e.g., SSD or flash memory device) boots up in read/write mode 120. The host interface 110 is subsequently configured (e.g., by commands 124 from the host device 122 or by the memory device 102 determining the context of operation) to a second mode, for example, read-only mode 116. In read-only mode 116, resources, such as write buffers, can be re-allocated for other uses.

In one embodiment, the first mode is a read-only mode; the first type of command is a read command; and the second type of command is a write command.

In one embodiment, the method further comprises, while the host interface is operating in the first mode, using the second resources for performing processing for the memory device other than processing the second type of command. In one example, memory device 102 is configured to operate in write-only mode 118. Memory or registers configured as read buffers can be re-allocated for use as write buffers.

In one embodiment, configuring the resources causes a reduction in processing time by the host interface for commands received from the host device. In one example, the memory device 102 is operating in write-only mode 118. Processing logic used to process read commands is re-allocated as a parallel pipeline for processing write commands, thus reducing the average time required to process write commands. In another example, if the write buffers fill up, the host device 122 must delay sending further write commands until write buffer space is available. Re-allocating read buffers for use as write buffers in write-only mode 118 enables the host device 122 to send more write commands without delay or with reduced delay.

In one embodiment, a memory device comprises: a host interface configured to implement a communication protocol for receiving commands from a host device; at least one of memory resources or processing resources to process the received commands based on a mode selected from one of a plurality of modes of operation for the host interface; at least one processing device; and memory containing instructions configured to instruct the at least one processing device to: select a first mode of operation for the host interface; and in response to selecting the first mode, configure the at least one of memory resources or processing resources to customize the host interface for operation in the first mode. In one example, the memory device 102 contains instructions that cause the memory device 102 to boot up in, for example, read-only mode 116 and customize the host interface 110 for read-only mode 116.

In one embodiment, the communication protocol allows usage of a first type of command and a second type of command; and the host interface, while operating in the first mode, allows usage of the first type of command, and suspends usage of the second type of command.

In one embodiment, the first mode is a write-only mode, the first type of command is a write command, and the second type of command is a read command.

In one embodiment, a non-transitory computer storage medium stores instructions which, when executed on a memory device, cause the memory device to at least: select a first mode of operation for a host interface that implements a communication protocol for communications between the memory device and a host device, wherein the host interface is configured to implement the communication protocol using a mode selected from one of a plurality of modes; and in response to selecting the first mode, configure resources of the memory device to customize the host interface for operation in the first mode.

In one embodiment, selecting the first mode comprises receiving, from the host device, a communication that indicates the first mode. In one example, the host device 122 sends a command 124 to the memory device 102 to operate in, for example, write-only mode 118.

In one embodiment, selecting the first mode comprises reading first data from a memory of the memory device, and the first data indicates the first mode. In one example, processing device 104 reads data from memory 106 and in response to reading data from memory 106 sets the mode of operation 114 of the host interface 110 to, for example, read-only mode 116.

In one embodiment, the resources are configured to implement a predetermined first pattern of data access. In one example, the memory device 102 is configured to boot up in, for example, read/write mode 120.

In one embodiment, the instructions further cause the memory device to, in response to selecting the first mode, obtain the first pattern from a non-volatile memory of the memory device; and the non-volatile memory stores a plurality of data access patterns including the first pattern.

In one embodiment, selecting the first mode comprises determining an application or software to be executed by the host device. In one example, the memory device 102 determines the application is a vehicle black box in normal operation and sets the mode of operation 114 of the host interface 110 to write-only mode 118.

Various additional embodiments are now described. In one embodiment, a method comprises: determining a first mode of operation for a memory device, wherein the memory device communicates with a host device via a host interface, and the memory device is configured to operate in a plurality of modes, the modes including a read/write mode, and further including at least one of a read-only mode or a write-only mode; and in response to determining the first mode, customizing the host interface.

In one embodiment, customizing the host interface comprises: determining configuration data corresponding to the first mode; and modifying, based on the configuration data, operation of the host interface.

In one embodiment, the first mode is the read-only mode, and customizing the host interface comprises suspending write functions by the host interface.

In one embodiment, the first mode is the write-only mode, and customizing the host interface comprises suspending read functions by the host interface.

In one embodiment, a communication is received from the host device by the host interface.

In one embodiment, determining the first mode comprises: evaluating, by a controller of the memory device, an output of a machine-learning model; and selecting the first mode based on the output.

In one embodiment, determining the first mode comprises: collecting, by a sensor of the memory device, sensor data; and selecting the first mode based on the sensor data.

In one embodiment, customizing the host interface comprises configuring a controller of the memory device to suspend read or write operations by the memory device.

In one embodiment, the method further comprises booting a controller of the memory device, wherein determining the first mode is performed after booting the controller.

In one embodiment, the method further comprises booting a controller of the memory device, wherein determining the first mode is performed prior to booting the controller.

In one embodiment, software of the memory device is configured to collect data from at least one sensor of a vehicle, the memory device is configured to operate as a black box of the vehicle, and the collected data is stored by the memory device during operation of the vehicle.

Figure 3:
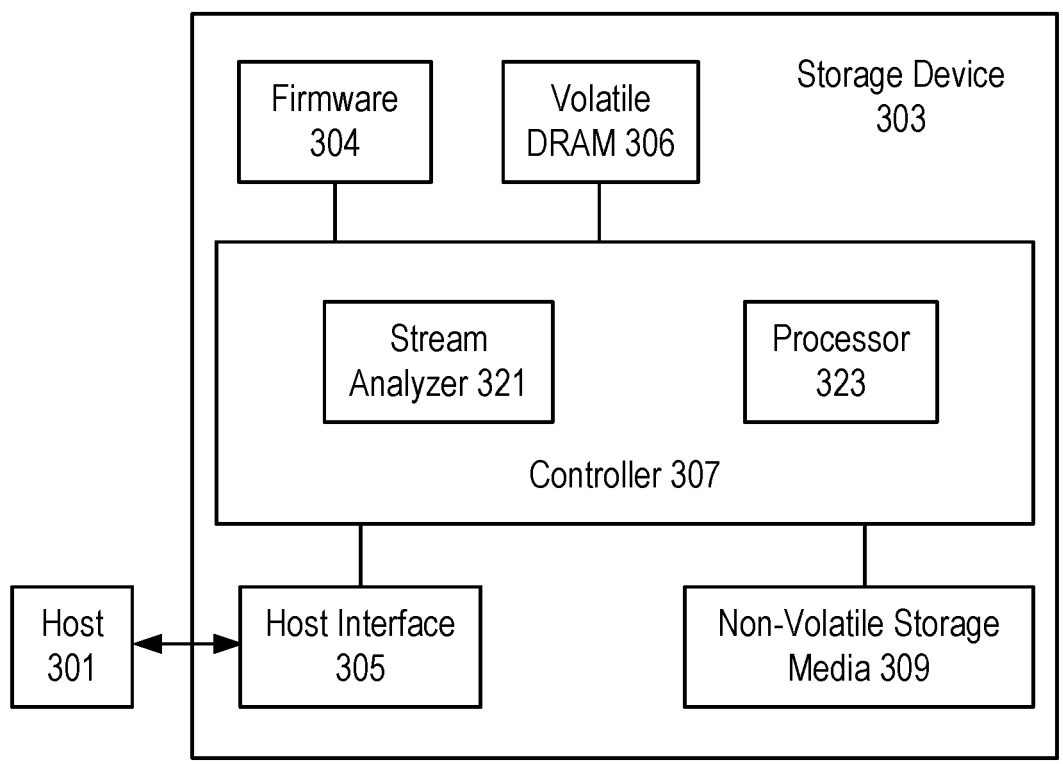
FIG. 3 illustrates a storage device that performs analysis to determine a context of operation based on commands received from a host, in accordance with some embodiments.

FIG. 3 illustrates a storage device 303 that performs analysis to determine a context of operation based on commands received from a host 301 by a host interface 305, in accordance with some embodiments. The storage device 303 is an example of memory device 102 of FIG. 1.

Storage device 303 includes a controller 307, which performs various functions based on commands received from host 301. Controller 307 includes a processor 323 and a stream analyzer 321. Processor 323 executes instructions provided by firmware 304. Processor 323 stores data in volatile DRAM 306 during analysis of commands and/or data that is performed using stream analyzer 321.

Stream analyzer 321 analyzes commands and/or data received from host 301. In one embodiment, a context operation of storage device 303 is determined by controller 307 based on results from analyzing the commands and/or data. Controller 307 may select a mode of operation based on the determined context of operation and/or otherwise as described herein. In response to selecting the mode of operation, controller 307 configures resources of storage device 303 to customize operation of storage device 303 for operation in the selected mode.

Controller 307 stores data in non-volatile storage media 309. Controller 307 accesses the stored data in response to commands from host 301.

Figure 4:
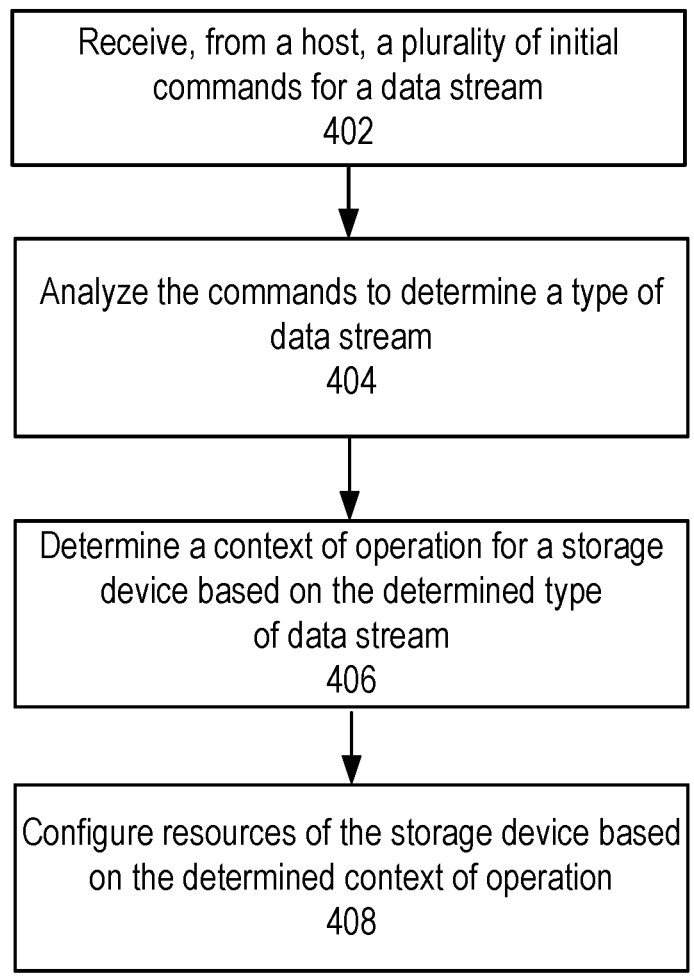
FIG. 4 shows a method for configuring resources of a storage device based on a determined context of operation, in accordance with some embodiments.

FIG. 4 shows a method for configuring resources of a storage device based on a determined context of operation, in accordance with some embodiments. For example, the method of FIG. 4 can be implemented in the system of FIG. 3. In one example, the storage device is storage device 303.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by one or more processing devices (e.g., controller 307 of FIG. 3).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 402, a plurality of initial commands for a data stream are received by a storage device from a host. In one example, the host is host 301.

At block 404, the commands are analyzed to determine a type of data stream. In one example, the data stream is analyzed to determine a proportion of read commands and/or write commands received from host 301.

At block 406, a context of operation for the storage device is determined based on the determined type of data stream. In one example, the context of operation corresponds to a black-box application, or to software that is executing on the host.

At block 408, resources of the storage device are configured based on the determined context operation. In one example, storage device 303 is configured to operate in a read-only mode or a write-only mode. In one embodiment, the resources are further configured based on a selected mode of operation of the storage device.

Figure 5:
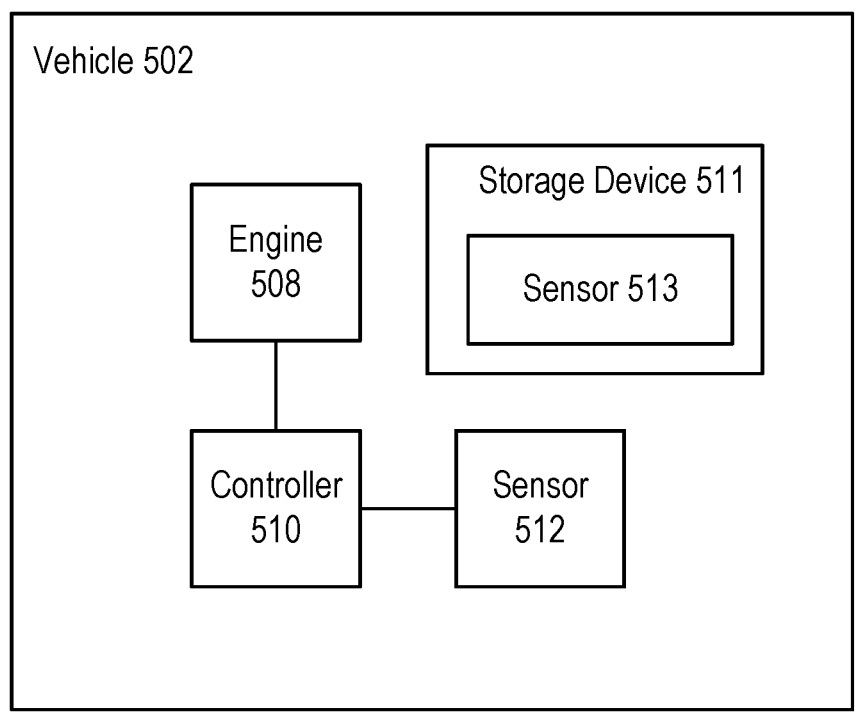
FIG. 5 illustrates a vehicle including a storage device that is configurable to operate in one of several modes of operation, in accordance with some embodiments.

FIG. 5 illustrates a vehicle 502 including a storage device 511 that is configurable to operate in one of several modes of operation, in accordance with some embodiments. Vehicle 502 is for example an autonomous vehicle such as a car or drone. Storage device 511 is an example of memory device 102 of FIG. 1.

Storage device 511 stores data for a controller 510. Controller 510 receives data at least in part from a sensor 512 of vehicle 502. In one example, sensor 512 is an accelerometer or a temperature sensor. Based on data received from sensor 512, controller 510 controls the operation of an engine 508 and/or other vehicle component. In one example, engine 508 is an internal combustion engine. In an alternative embodiment, an electric motor can be used instead of engine 508.

Storage device 511 includes a sensor 513. In one example, sensor 513 provides data regarding a temperature of a non-volatile storage media (not shown) of storage device 511 that is used to store data received from controller 510.

In one embodiment, a context of operation is determined for storage device 511. Storage device 511 selects a mode of operation based at least in part on the determined context of operation. In some cases, the mode of operation is further based on data provided by controller 510. The data provided by controller 510 may be based on data received from sensor 512 and/or a state of operation of a vehicle component such as engine 508. In one example, storage device 511, in response to selecting the mode of operation, configures resources of storage device 511 as described above for FIG. 1. In one example, the selected mode is read-only mode 116 or write-only mode 118.

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and operations may be described as being performed by or caused by software code to simplify description. However, those skilled in the art will recognize what is meant by such expressions is that the functions result from execution of the code by one or more processors, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
   a temperature sensor and an accelerometer configured in a vehicle, the temperature sensor and accelerometer to determine the vehicle is in crash;
   a host interface having a plurality of resource configurations each corresponding to a different mode of operation of the host interface, wherein the host interface is configured to receive a stream of commands from a host device, and wherein host interface signals are used to transmit read data and write data;
   at least one processing device; and
   memory containing instructions configured to instruct the at least one processing device to:
      select, based on signaling from the temperature sensor and accelerometer, a first mode of operation of the host interface;
      in response to selecting the first mode, configuring the host interface to a first resource configuration of the plurality of resource configurations, the first resource configuration corresponding to the first mode of operation;
      power-up with the host interface in a second mode of operation, wherein the second mode of operation is a read/write mode;
      analyze the stream of commands while operating in the read/write mode;

dynamically change, based on analyzing the stream of commands, a number of the signals used to transmit the read data in the read/write mode, and a number of the signals used to transmit the write data in the read/write mode; and after power-up, change the mode of operation of the host interface to a third mode of operation, wherein the third mode is a write-only mode or a read-only mode, wherein changing the mode of operation to the third mode is implemented in response to receiving a command from the host device.

2. The apparatus of claim 1, wherein the instructions are further configured to instruct the at least one processing device to:

analyze data received from the host device; and
determine a context of operation based on the analyzing;
wherein selecting the first mode is further based on the determined context of operation.

3. The apparatus of claim 1, wherein the plurality of resource configurations are configured in a memory device, and the instructions are further configured to instruct the at least one processing device to:

determine a context of operation for the memory device;
wherein selecting the first mode is further based on the context of operation.

4. The apparatus of claim 1, wherein the plurality of resource configurations are configured in a memory device, and the instructions are further configured to instruct the at least one processing device to:

receive context data from the host device, the context data indicating a type of application that will be executed by the host device.

5. The apparatus of claim 1, wherein the first mode is a write-only mode, and selecting the first mode is further based on determining that an application of the host device is a black box.

6. The apparatus of claim 1, wherein configuring the host interface to the first resource configuration comprises changing an allocation of regions of memory to the processing device.

7. The apparatus of claim 6, wherein changing the allocation comprises changing a portion of memory space allocated for handling execution of instructions by the processing device.

8. The apparatus of claim 7, wherein changing the portion of memory space includes increasing an allocation of memory space to storage of data or commands received from the host device.

9. The apparatus of claim 1, wherein the instructions are further configured to instruct the at least one processing device to:

receive sensor data from at least one sensor of the host device;
wherein selecting the first mode is further based on the sensor data received from the sensor of the host device.

10. A method comprising:

receiving, by a memory device, signaling from a temperature sensor and an accelerometer in a vehicle, to determine the vehicle is in a crash;
selecting, based on the signaling from the temperature sensor and accelerometer, a first mode of operation from a plurality of modes of operation for a host interface of the memory device;
in response to selecting the first mode, configuring the host interface to a first resource configuration of a plurality of resource configurations, the first resource configuration corresponding to the first mode;
receiving, by the host interface, a first stream of commands from a host device, wherein host interface signals are used to transmit read data and write data;
processing, by the host interface, the first stream of received commands;
powering-up with the host interface in a second mode of operation, wherein the second mode of operation is a read/write mode;
receiving, by the host interface, a second stream of commands from the host device, wherein the host interface signals are used to transmit read data and write data;
analyzing the second stream of commands;
dynamically changing, based on analyzing the second stream of commands, a number of the signals used to transmit the read data in the read/write mode, and a number of the signals used to transmit the write data the read/write mode; and
after powering-up, change the mode of operation of the host interface to a third mode of operation, wherein the third mode is a write-only mode or a read-only mode, wherein changing the mode of operation to the third mode is implemented based on analyzing a third stream of commands received by the host interface from the host device.

11. The method of claim 10, further comprising:
analyzing a stream of data received from the host device;
wherein selecting the first mode is further based on the analyzed stream of data.

12. The method of claim 10, wherein the temperature sensor is configured in a vehicle, the method further comprising controlling operation of a component of the vehicle based on data from the temperature sensor.

13. The method of claim 10, wherein the signaling from the temperature sensor indicates a temperature of a non-volatile storage media.

14. A non-transitory computer-readable storage medium storing instructions which, when executed on a memory device, cause the memory device to:

receive data from a temperature sensor and an accelerometer in a vehicle;
select, based on the data from the temperature sensor and the accelerometer, a first mode of operation from a plurality of modes of operation for a host interface of the memory device;
in response to selecting the first mode, configure resources of the host interface of the memory device for operation in the first mode;
receive, by the host interface, commands from a host device;
process, by the configured resources, the received commands;
power-up with the host interface in a second mode of operation, wherein the second mode of operation is a read/write mode;
receive, by the host interface while in the read/write mode, a stream of commands from the host device, wherein host interface signals are used to transmit read data and write data associated with the commands;
analyze the stream of commands; and
change, based on analyzing the stream of commands, a number of the signals used to transmit the read data in the read/write mode, and a number of the signals used to transmit the write data in the read/write mode.

15. The non-transitory computer-readable storage medium of claim 14, wherein:

the host interface is configured to implement a communication protocol that allows usage of a write command and a read command; and the host interface, while operating in the first mode, allows usage of the write command, and suspends usage of the read command.

16. The non-transitory computer-readable storage medium of claim 15, wherein configuring the resources causes a reduction in processing time by the host interface for commands received from the host device.

17. The non-transitory computer-readable storage medium of claim 14, wherein the resources include at least one of a memory region, a register, or a processing device.

18. The non-transitory computer-readable storage medium of claim 14, wherein the resources are configured to implement a predetermined pattern of data access.

19. The non-transitory computer-readable storage medium of claim 14, wherein the instructions further cause the memory device to:

store a plurality of data access patterns; and in response to selecting the first mode, select a first data access pattern from the plurality of data access patterns.

\* \* \* \* \*